(12) United States Patent
Takatsu (10) Patent No.: US 6,407,447 B1
(45) Date of Patent: *Jun. 18, 2002

(54) TAPE CARRIER PACKAGE

(75) Inventor: Norio Takatsu, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/542,998

(22) Filed: Apr. 4, 2000

(30) Foreign Application Priority Data

Apr. 7, 1999 (JP) ............................. 11-099527

(51) Int. Cl.$^7$ .............................. H01L 23/02
(52) U.S. Cl. ................. 257/678; 257/668; 257/779; 361/749; 361/760
(58) Field of Search ................. 257/668, 797, 257/48, 666, 678, 680, 735; 361/749, 760, 761, 776, 813

(56) References Cited

U.S. PATENT DOCUMENTS

| | | | | |
|---|---|---|---|---|
| 5,220,486 A | * | 6/1993 | Takubo et al. | 361/388 |
| 5,554,885 A | * | 9/1996 | Yamasaki et al. | 257/666 |
| 5,744,859 A | * | 4/1998 | Ouchida. | 257/668 |
| 5,753,969 A | * | 5/1998 | Suzuya et al. | 257/667 |
| 5,757,068 A | * | 5/1998 | Kata et al. | 257/668 |
| 5,932,927 A | * | 8/1999 | Koisumi et al. | 257/728 |

FOREIGN PATENT DOCUMENTS

| | | |
|---|---|---|
| JP | 3-85740 | 4/1991 |
| JP | 3-101140 | 4/1991 |
| JP | 4-162734 | 6/1992 |
| JP | 5-251510 | 9/1993 |
| JP | 5-275498 | 10/1993 |
| JP | 9-213737 | 8/1999 |

* cited by examiner

Primary Examiner—Elvin Enad
Assistant Examiner—Kyung S. Lee
(74) Attorney, Agent, or Firm—Young & Thompson (57) ABSTRACT

A tape carrier package, in which inner leads are prevented from bending by external force, and the yield is made to improve, and short-circuits at non-intentional positions between wiring on a base film and a semiconductor pellet caused by heat at bonding can be prevented. Conductive leads are provided on a base film in a state that the ends of the conductive leads do not stick out to a device hole, and holes are provided at the four corners of the device hole on the base film at the outside of the device hole. With this structure, the inner leads of the conductive leads are prevented from bending by external force, and it makes easy that the base film including the inner leads is formed to a desiring forming shape.

6 Claims, 7 Drawing Sheets

TAPE CARRIER PACKAGE

BACKGROUND OF THE INVENTION

The present invention relates to a tape carrier package, to which semiconductor pellets are bonded and which is used for such as a flexible printed circuit (FPC), in particular, in which a tape automated bonding (TAB) tape is used.

DESCRIPTION OF THE RELATED ART

Figure 1:
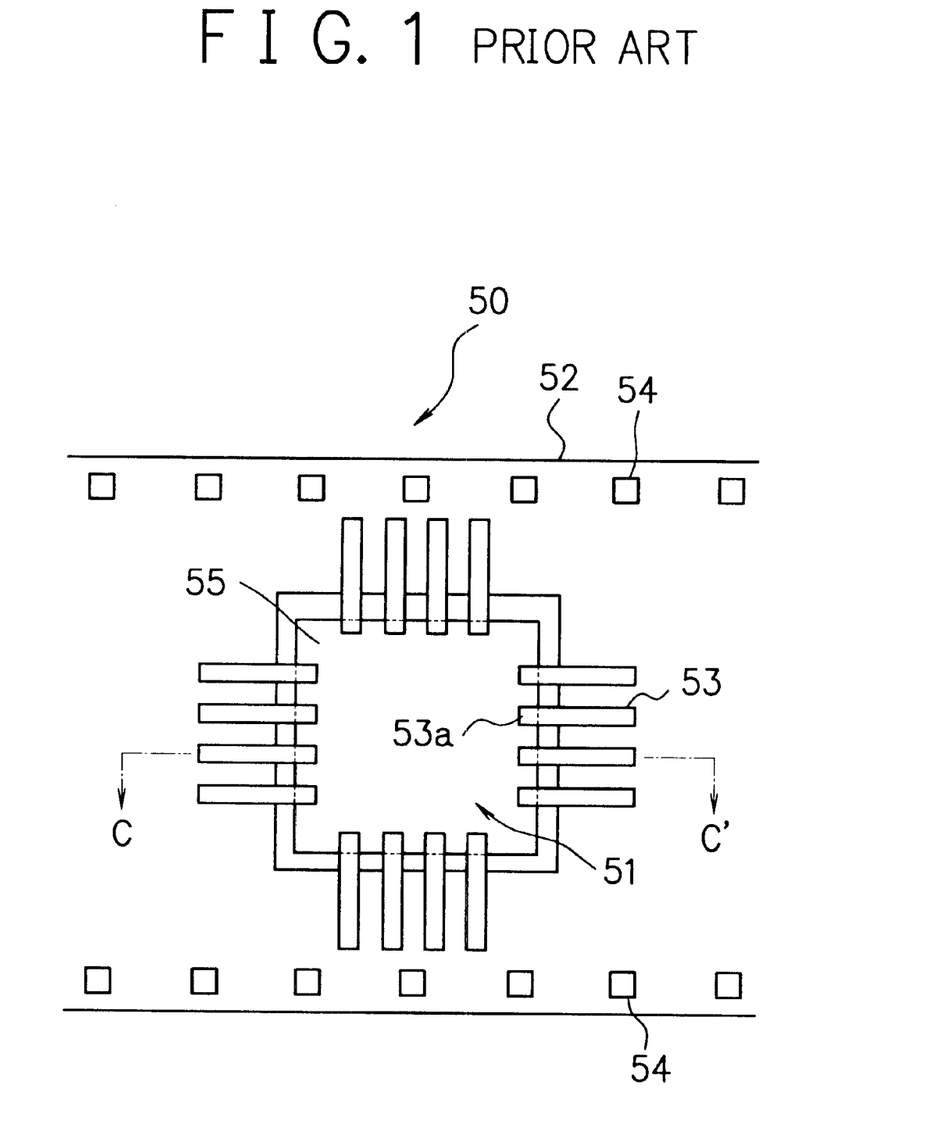
FIG. 1 is a plan view of a first example of a conventional tape carrier package.
Figure 2:
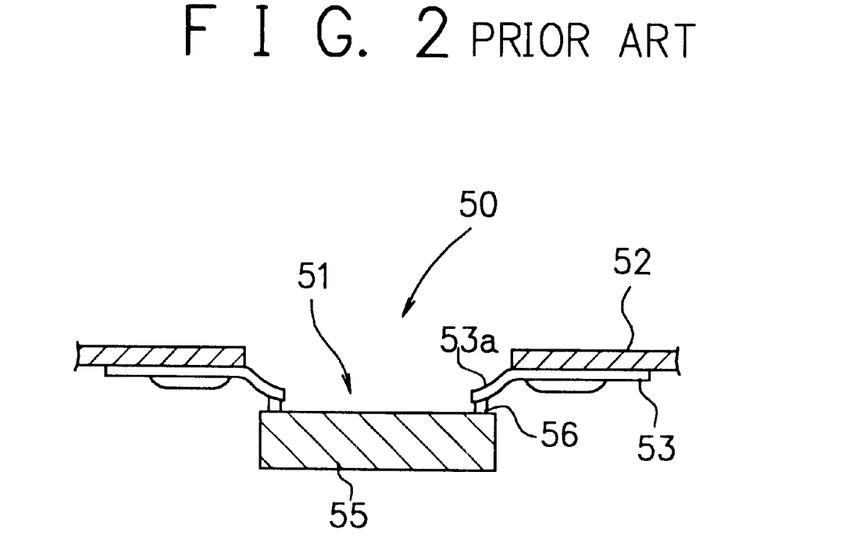
FIG. 2 is a sectional view at the C to C' section of FIG. 1.

First, a first example of a conventional tape carrier package is explained. FIG. 1 is a plan view of the first example of the conventional tape carrier package. FIG. 2 is a sectional view at the C to C' section of FIG. 1. As shown in FIGS. 1 and 2, a conventional tape carrier package 50 provides plural conductive leads 53 on a base film 52 having a device hole 51 whose shape is rectangular. And inner leads 53a of the conductive leads 53 are formed in a state that the inner leads 53a stick out to the device hole 51. Furthermore, sprocket holes 54 are provided at the both edges side of the base film 52 in a state that the sprocket holes 54 have the same intervals.

A semiconductor pellet (die) 55 provides plural metal bumps 56, and each of the plural metal bumps 56 is bonded to a corresponding inner lead 53a of the conductive leads 53 by a heat press of a pressing tool (not shown).

Figure 3:
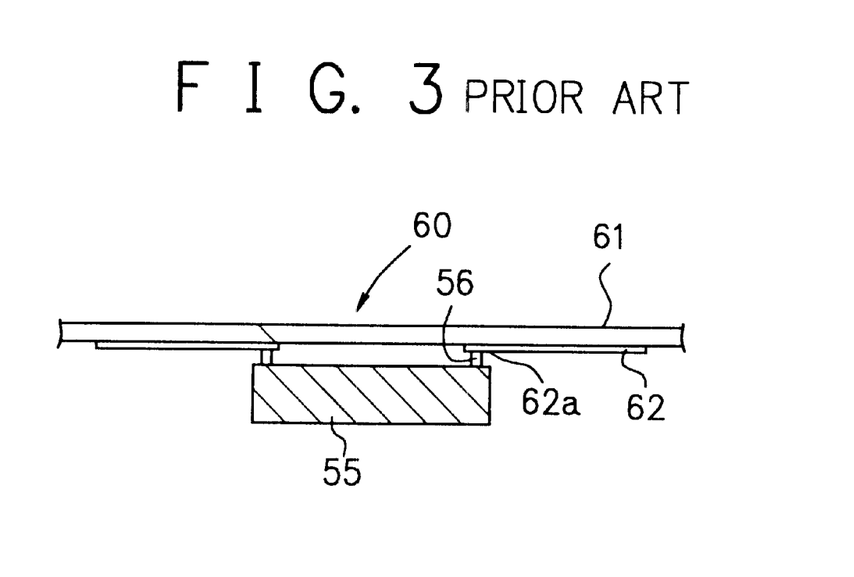
FIG. 3 is a sectional view of a second example of the conventional tape carrier package.

Next, a second example of the conventional tape carrier package is explained. FIG. 3 is a sectional view of the second example of the conventional tape carrier package. In this, at the second example, equivalent elements to the first example shown in FIGS. 1 and 2 have the same reference numbers, and the same explanation is omitted. As shown in FIG. 3, a conventional tape carrier package 60 provides a base film 61 not having a device hole, and plural conductive leads 62 are provided on this base film 61. And a semiconductor pellet 55 provides plural metal bumps 56, and each of the plural metal bumps 56 is bonded to a corresponding inner lead 62a of the conductive leads 62 by a heat press of a pressing tool (not shown).

This second example is a tape carrier package used so called a face down bonding system. At this tape carrier package, the inner leads 62a are fixed to the base film 61, therefore this package has a characteristic that the inner leads 62a are not bent easily by external force. This example is disclosed in Japanese Patent Application Laid-Open No. HEI 5-251510.

Figure 4:
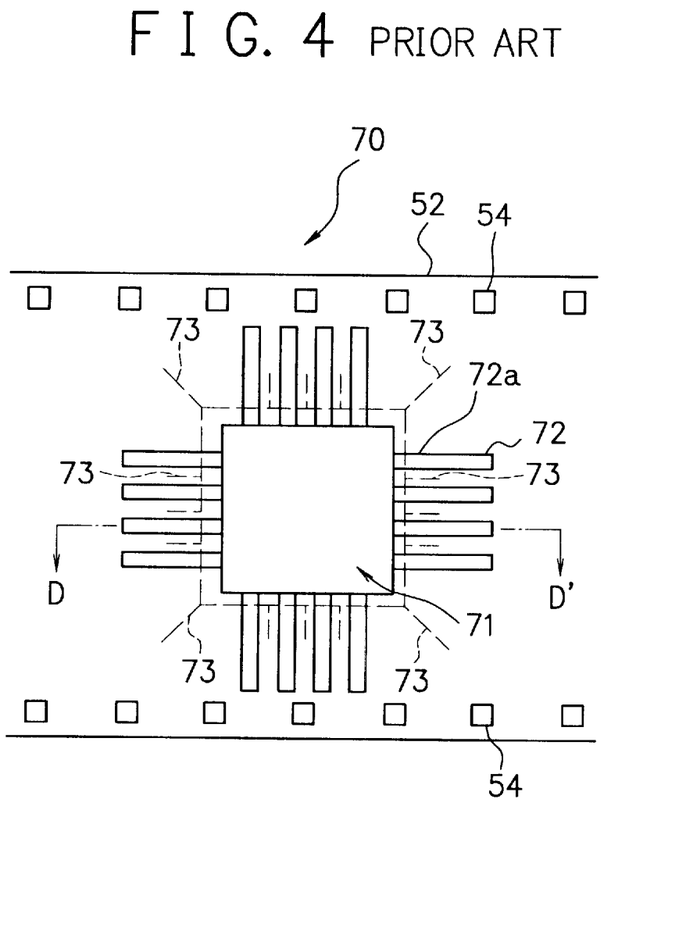
FIG. 4 is a plan view of a third example of the conventional carrier package.
Figure 5:
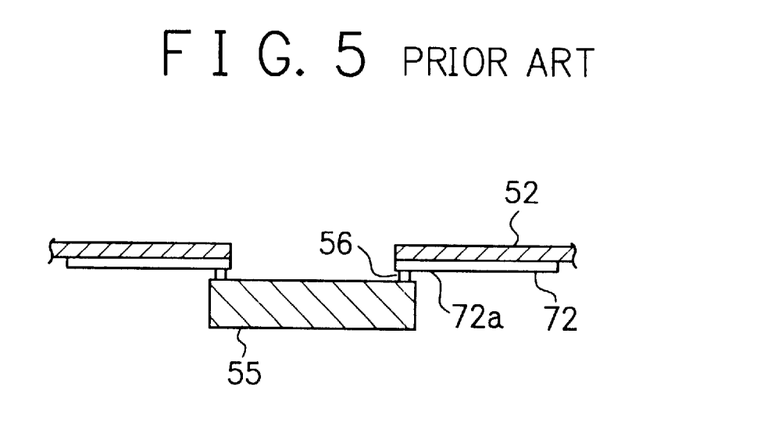
FIG. 5 is a sectional view at the D to D' section of FIG. 4.

Next, a third example of the conventional tape carrier package is explained. This third type example is disclosed in Japanese Patent Application Laid-Open No. HEI 3-85740 and Japanese Patent Application Laid-Open No. HEI 3-101140. FIG. 4 is a plan view of the third example of the conventional tape carrier package. FIG. 5 is a sectional view at the D to D' section of FIG. 4. In this, at the third example, equivalent elements to the first example shown in FIGS. 1 and 2 have the same reference numbers, and the same explanation omitted. As shown in FIGS. 4 and 5, a conventional tape carrier package 70 provides plural conductive leads 72 on a base film 52 having a device hole 71 whose shape is rectangular. And inner lead 72a of the conductive leads 72 are formed in a state that the inner leads 72a do not stick out to the device hole 71. Furthermore, sprocket holes 54 are provided at the both edge sides of the base film 52 in a state that the sprocket holes 54 have the same intervals.

And a semiconductor pellet 55 provides plural metal bumps 56, and each of the plural metal bumps 56 is bonded to a corresponding inner lead 72a of the conductive leads 72 by a heat press of a pressing tool (not shown).

And at least one or more slits 73 are provided at the base film 52 between adjacent conductive leads 72 at the near parts of the tip of the inner leads 72a of the conductive leads 72. By providing this kind of slits 73, a stress generated by the differences of thermal expansion coefficients and humidity expansion coefficients among a sealing resin material (not shown) using at bonding, the conductive leads 72, the base film 52, and the semiconductor pellet 55 can be absorbed. With these slits, defects caused by cracking of the resin material and braking of leads can be prevented.

However, at the tape carrier package 50 of the first example, the inner leads 53a float in the air, as a result, there is a problem that the inner leads 53a are easily bent by external force. In order to solve this problem, the tape carrier package 60 of the second example was developed. However, at this tape carrier package 60, the alignment between the semiconductor pellet 55 and the inner leads 62a is technically difficult, consequently, there is a problem that the yield is reduced. As the same as the second example, in order to solve the problem of the tape carrier package 50 of the first example, the tape carrier package 70 of the third example was also developed. However, at this tape carrier package 70, the base film 52 is deformed by the temperature at the bonding, as a result, there is a problem that non-intentional positions between the semiconductor pellet 55 and the conductive leads 72 may become short-circuit accidentally.

SUMMARY OF THE INVENTION

It is therefore an object of the present invention to provide a tape carrier package, in which inner leads are prevented from bending by external force, and the yield is made to improve, and non-intentional short-circuits between wiring on a base film and a semiconductor pellet caused by heat at bonding can be prevented.

According to the present invention, for achieving the objects mentioned above, there is provided a tape carrier package. Said tape carrier package provides a base film in which rectangular shaped first holes are provided, plural conductive leads, whose one ends are positioned not sticking out to each of said rectangular shaped first holes, on said base film, a second holes provided at the corner parts of each of said rectangular shaped first holes on said base film at the outside of each of said rectangular shaped first hole, and a semiconductor pellet in which plural metal bumps are provided. And said plural metal bumps are bonded to corresponding ends of said plural conductive leads.

According to the present invention, said conductive leads are provided on said base film in a state that said one ends of said conductive leads do not stick out to each of said rectangular shaped first holes, and said second holes are provided at the corner parts of each of said rectangular shaped first holes at the outside of each of said rectangular shaped first holes. With this structure, inner leads of said conductive leads are prevented from bending by external force, the yield is made to improve, and short-circuits at non-intentional positions between wiring on said base film and said semiconductor pellet caused by heat at bonding can be prevented.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 6:
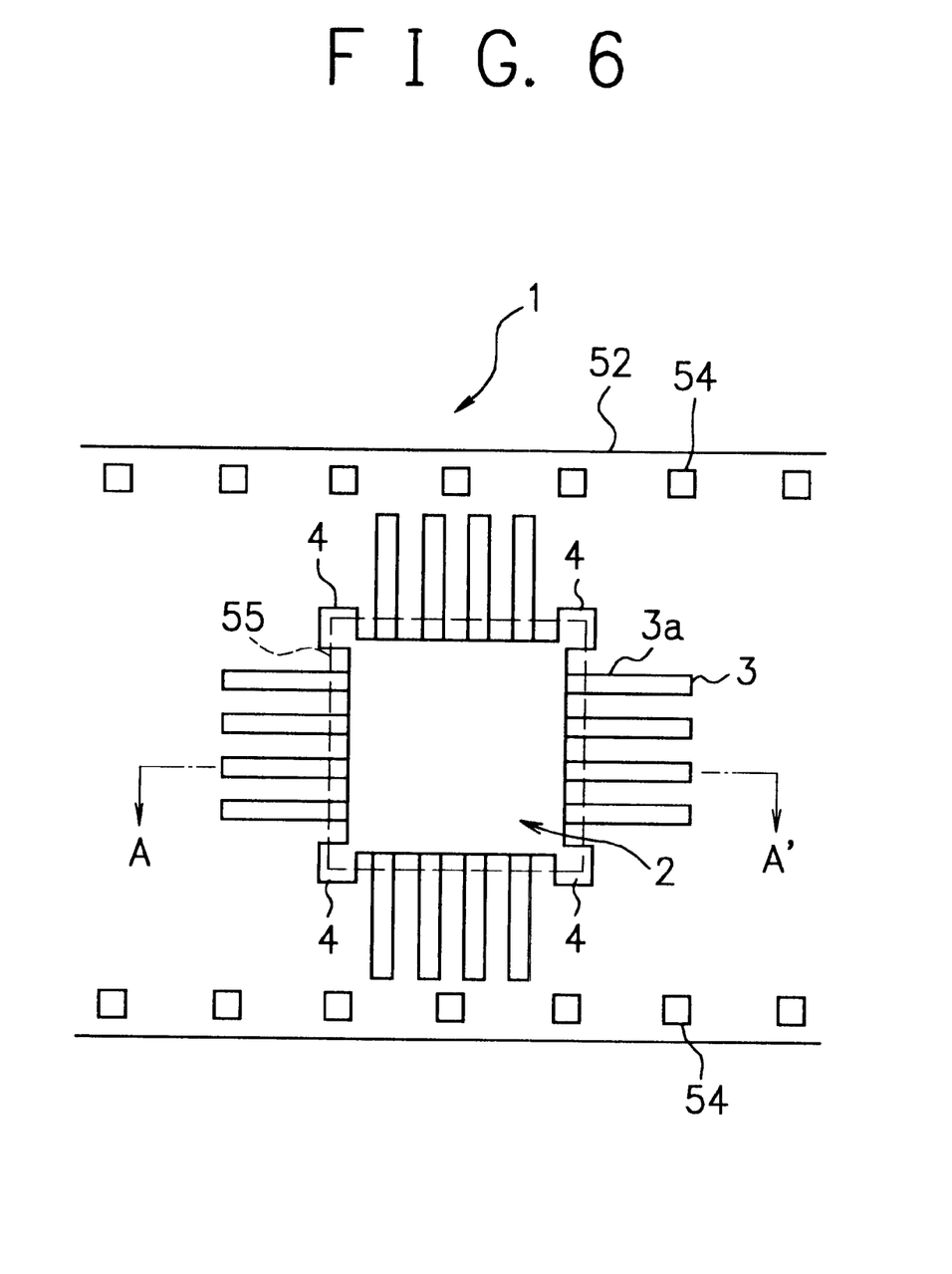
FIG. 6 is a plan view of a first embodiment of a tape carrier package of the present invention.
Figure 7:
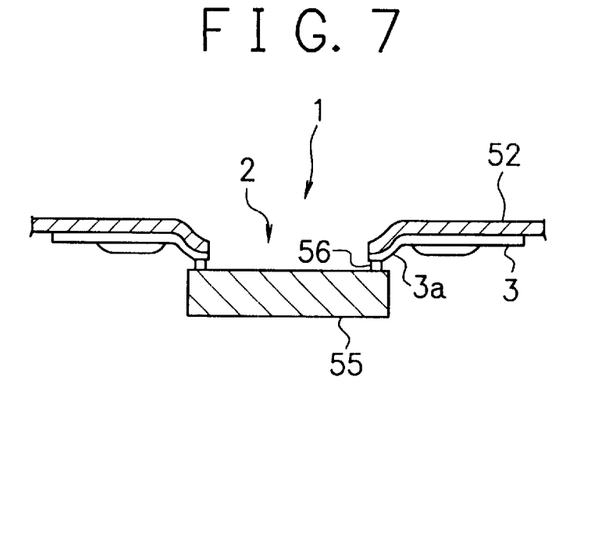
FIG. 7 is a sectional view at the A to A' section of FIG. 6.

Referring now to the drawings, embodiments of the present invention are explained in detail. The present invention relates to a tape carrier package using a tape automated bonding (TAB) tape, which has a structure in which wiring patterns are formed on a base film such as a polyimide resin material. In the embodiments, a structure of the tape carrier package having only one semiconductor pellet is explained, however actually many semiconductor pellets are sequentially bonded on the tape carrier package. First, a first embodiment of the present invention is explained. FIG. 6 is a plan view of the first embodiment of the tape carrier package of the present invention. FIG. 7 is a sectional view at the A to A' section of FIG. 6. In this, at the first embodiment, equivalent elements to the conventional examples shown in FIGS. 1 to 5 have the same reference numbers, and the same explanation is omitted. As shown in FIGS. 6 and 7, a tape carrier package 1 provides plural conductive leads 3 on a base film 52 having a device hole 2 whose shape is rectangular. And inner leads 3a of the conductive leads 3 are formed in a state that the inner leads 3a do not stick out to the device hole 2 and are contained on the base film 52. Furthermore, sprocket holes 54 are provided at the both edge sides of the base film 52 in a state that the sprocket holes 54 have the same intervals.

A semiconductor pellet 55 provides plural metal bumps 56, and each of the plural metal bumps 56 is bonded to a corresponding inner lead 3a of the conductive leads 3 by a heat press of a pressing tool (not shown). And the rectangular shaped device hole 2 is smaller than the size of the semiconductor pellet 55 and works as recognizing the semiconductor pellet 55.

And holes 4 are formed at the four corners of the device hole 2 on the base film 52 at the outside of the device hole 2. These holes 4 are formed in a state that the holes 4 are connected to the device hole 2. By providing the holes 4 at these positions, the base film 52 including the inner leads 3a can be easily formed to a desired forming shape. That is, by forming a suitable slant (desired forming shape) to the parts of the inner leads 3a, a defect such as an edge touching, that is an edge of the semiconductor pellet 55 touching a pattern of a flexible printed circuit (FPC) at mounting can be prevented. In other words, by providing the holes 4 at t eh four corners of the device hole 2 at the outside device hole 2, the base film 52 can easily be formed two dimensionally. As a result, the edge touching is prevented by that the forming can be applied to the parts of the inner leads 3a. At the third example of the conventional tape carrier package, the slits 73 are provided as shown in FIG. 4, however the first embodiment of the present invention does not provide slits, therefore the adjacent inner leads 3a do not touch each other.

Figure 8:
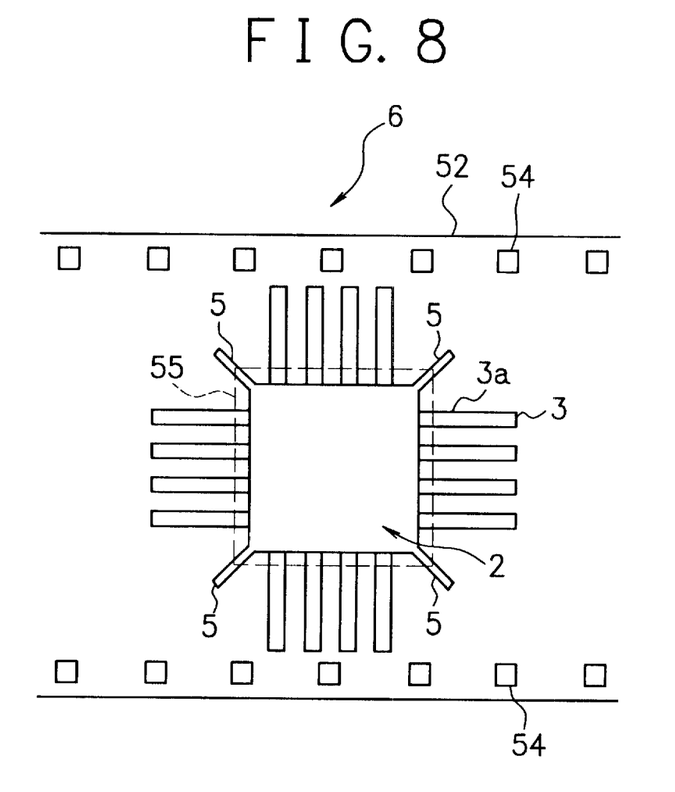
FIG. 8 is a plan view of a second embodiment of the tape carrier package of the present invention.

Next, a second embodiment of the present invention is explained. FIG. 8 is a plan view of the second embodiment of the tape carrier package of the present invention. In this, at the second embodiment, equivalent elements to the first embodiment shown in FIGS. 6 and 7 have the same reference numbers, and the same explanation is omitted. The different point between a tape carrier package 6 of the second embodiment and the tape carrier package 1 of the first embodiment is that the tape carrier package 6 of the second embodiment provides slots 5 instead of the holes 4 at the first embodiment. That is, the slots 5 are provided at the four corners of the device hole 2 on the base film 52 at the outside of the device hole 2. These slots 5 are formed in a state that the slots 5 connect to the device hole 2. By providing the slots 5 at these positions, the equivalent effect to the first embodiment can be obtained.

Figure 9:
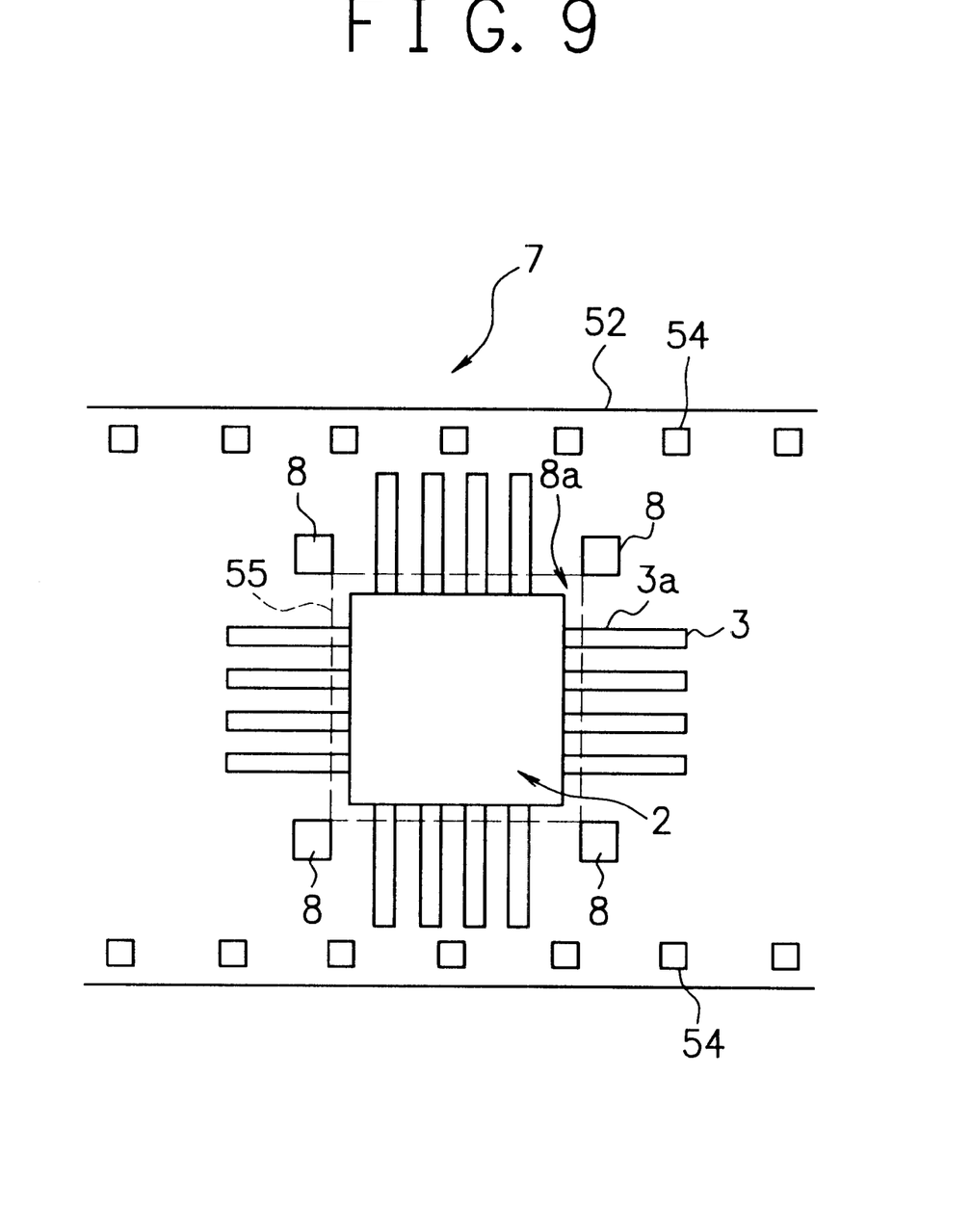
FIG. 9 is a plan view of a third embodiment of the tape carrier package of the present invention.

Next, a third embodiment of the present invention is explained. FIG. 9 is a plan view of the third embodiment of the tape carrier package of the present invention. In this, at the third embodiment, equivalent elements to the first embodiment shown in FIGS. 6 and 7 have the same reference numbers, and the same explanation is omitted. The different point between a tape carrier package 7 of the third embodiment and the tape carrier package 1 of the first embodiment is that the tape carrier package 7 of third embodiment provides holes 8 instead of the holes 4 at the first embodiment, and the holes 8 are provided at the different positions from the holes 4 of the first embodiment. That is, the holes 8 are provided at the four corners of the device hole 2 on the base film 52, but are not connected to the device hole 2. By providing the holes 8 at these positions, a bridge 8a, which is a part of the base film 52, is formed between the holes 8 and the device hole 2. When a forming is applied to the part of the inner leads 3a, the bridge 8a is stretched and the forming is easily performed. As a result, an equivalent effect to the first embodiment can be obtained at the third embodiment.

Figure 10:
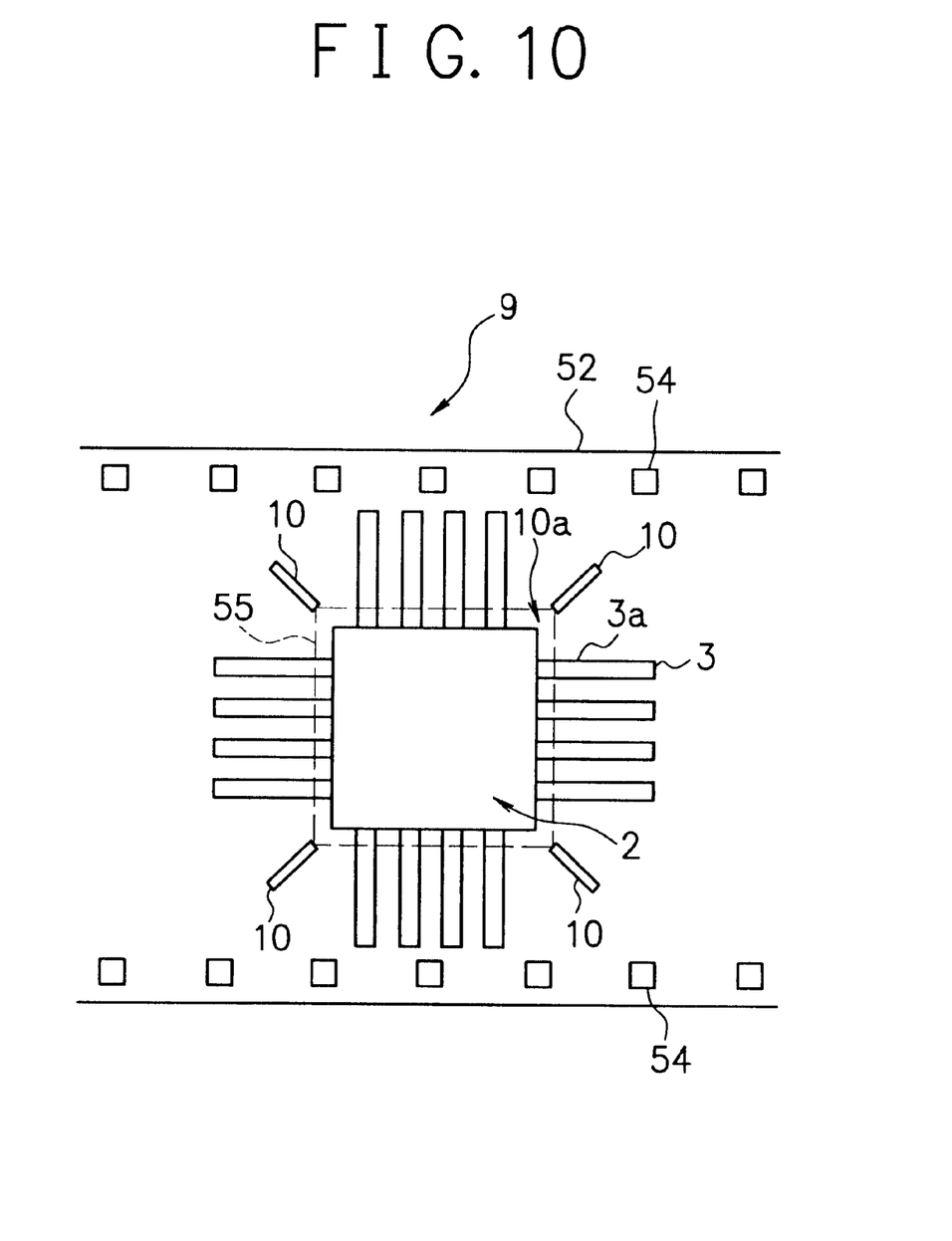
FIG. 10 is a plan view of a fourth embodiment of the tape carrier package of the present invention.

Last a fourth embodiment of the present invention is explained. FIG. 10 is a plan view of the fourth embodiment of the tape carrier package of the present invention. In this, at the fourth embodiment, equivalent elements to the second embodiment shown in FIG. 8 have the same reference numbers, and the same explanation is omitted. The different point between a tape carrier package 9 of the fourth embodiment and the tape carrier package 6 of the fourth embodiment provides slots 10 instead of the slots 5 at the second embodiment, and the slots 10 are provided at the different positions from the slots 5 of the second embodiment. That is, the slots 10 are provided at the four corners of the device hole 2. By providing the slots 10 at these positions, a bridge 10a being a part of the base film 52 is formed between the slots 10 and the device hole 2. When a forming is applied to the part of the inner leads 3a, the bridge 10a is stretched and the forming is easily performed. As a result, an equivalent effect to the first embodiment can be obtained at the forth embodiment.

According to a tape carrier package of the present invention, the tape carrier package provides a base film in which a rectangular shaped first hole is provided, plural conductive leads, whose one ends are positioned not sticking out to the rectangular shaped first hole, on the base film, second holes provided at the corner parts of the rectangular shaped first hole on the base film at the outside of the rectangular shaped first hole, and a semiconductor pellet in which plural metal bumps are provided, and the plural metal bumps are bonded to corresponding ends of the conductive leads. With this structure, inner leads of the conductive leads are prevented from bending by external force, and the yield is made to improve, and short-circuits at non-intentional positions between the wiring on the base film and the semiconductor pellet caused by heat at bonding can be prevented.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A tape carrier package comprising:

a base film having a rectangular shaped device hole;

a plurality of apertures in said base film, said apertures being at corners of said device hole and connected to said device hole;

a plurality of conductive leads on said base film, each said lead having a first end, each said first end terminating at an edge of said device hole and not extending inside said device hole; and a semiconductor pellet having plural metal bumps that electrically connect said pellet to said plural conductive leads.

2. The tape carrier package according to claim 1, wherein the apertures are slots.

3. The tape carrier package according to claim 1, wherein the apertures are at four outside corners of the device hole.

4. The tape carrier package according to claim 2, wherein the slots are at four outside corners of the device hole.

5. A tape carrier package comprising:

a base film having a rectangular shaped device hole;

a plurality of apertures in said base film, said apertures being at corners of said device hole and connected to said device hole;

a plurality of conductive leads on said base film, each said lead having a first end, each said first end terminating outside said device hole; and a semiconductor pellet having plural metal bumps that electrically connect said pellet to said plural conductive leads.

6. A tape carrier package comprising:

a base film having a rectangular shaped device hole;

a plurality of apertures in said base film, said apertures being at corners of said device hole and connected to said device hole;

a plurality of conductive leads on said base film, each said lead having a first end, each said first end terminating at said device hole, an entirety of said device hole being visible in plan view; and a semiconductor pellet having plural metal bumps that electrically connect said pellet to said plural conductive leads.

* * * * *